(12) United States Patent
Pradeep et al.

(10) Patent No.: US 6,337,262 B1
(45) Date of Patent: Jan. 8, 2002

(54) SELF ALIGNED T-TOP GATE PROCESS INTEGRATION

(75) Inventors: Yelehanka Ramachandramurthy Pradeep; Chivukula Subrahmanyam; Vijai Kumar Chhagan; Henry Gerung, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/519,611

(22) Filed: Mar. 6, 2000

(51) Int. Cl.[7] .......................... H01L 21/28; H01L 21/44
(52) U.S. Cl. ...................... 438/574; 438/182; 438/570; 438/579; 438/595
(58) Field of Search .............................. 438/182, 574, 438/229–230, 259, 570, 573–579, 975, 595

(56) References Cited

U.S. PATENT DOCUMENTS

| | | | |
|---|---|---|---|
| 5,358,885 A | * 10/1994 | Oku et al. | 438/571 |
| 5,484,740 A | * 1/1996 | Cho | 438/167 |
| 5,600,168 A | 2/1997 | Lee | 257/336 |
| 5,610,091 A | * 3/1997 | Cho | 438/259 |
| 5,733,383 A | * 3/1998 | Fazan et al. | 148/33.3 |
| 5,837,612 A | 11/1998 | Ajuria et al. | 438/697 |
| 5,869,396 A | 2/1999 | Pan et al. | 438/647 |
| 5,943,576 A | 8/1999 | Kapoor | 438/302 |
| 5,963,818 A | 10/1999 | Kao et al. | 438/424 |
| 6,077,761 A | * 6/2000 | Chen et al. | 438/574 |
| 6,096,641 A | * 8/2000 | Kunikiyo | 438/653 |
| 6,124,177 A | * 9/2000 | Lin et al. | 438/305 |
| 6,159,781 A | * 12/2000 | Pan et al. | 438/167 |
| 6,214,670 B1 | * 4/2001 | Shih et al. | 438/259 |

FOREIGN PATENT DOCUMENTS

| | | | |
|---|---|---|---|
| JP | 63-174374 | * | 7/1988 |
| JP | 63-204772 | * | 8/1998 |

* cited by examiner

Primary Examiner—Eddie Lee
Assistant Examiner—José R. Díaz
(74) Attorney, Agent, or Firm—George O. Saile; Rosemary L. S. Pike (57) ABSTRACT

A new method is provided for the integration of the of T-top gate process. Active regions are defined and bounded by STI's on the surface of a substrate. The pad oxide is removed from the substrate and replaced by a layer of SAC oxide. A thin layer of nitride is deposited that covers the surface of the created layer of SAC oxide and the surface of the STI regions. A layer of TEOS is deposited and etched defining the regions where the gate electrodes need to be formed. Gate spacers are next formed on the sidewalls of the openings that have been created in the layer of TEOS. The required implants (such as channel implant and threshold implant) are performed, the gate structure is then grown in the openings that have been created in the layer of TEOS. After the gate structure has been completed, the surface of the created structure is polished and the remaining layer of TEOS is removed. Source and drain regions implants can now be performed, LDD regions are implanted using a tilted implant. This tilted implant penetrates underneath the body of the created gate structures thereby creating the LDD regions. The removal of the layer of TEOS leaves in place the gate structures, one such structure is located in the active region of the surface of the substrate, two additional structures that have been created on the surface of the STI regions.

5 Claims, 5 Drawing Sheets

SELF ALIGNED T-TOP GATE PROCESS INTEGRATION

BACKGROUND OF THE INVENTION

(1) Field of the Invention

The invention relates to the fabrication of integrat circuit devices, and more particularly, to a method for forming a T-Top gate electrode structure.

(2) Description of the Prior Art

Field Effect Devices (FET's) form, in the creation of semiconductor devices, an important class of devices that has, as a consequence, received a considerable amount of attention in its construction and the many refinements that have been applied to this construction. The gate electrode structure forms an essential part of FET devices, this gate electrode is created using repetitive applications of photolithography combined with etch processing steps. This sequence of processing steps is relatively complex and does therefore require close control of tolerances for the proper alignments of the various features that are being created. Incorrect alignment results in increased yield loss and potential problems of device reliability. A method therefore that simplifies this process and that makes the process less dependent on the inherent challenge of using photolithography alignments and the therewith associated steps of plasma etching (a potential source for plasma damage to exposed surfaces) will enhance gate electrode production sequences and improve gate electrode yields, thereby reducing the cost of the device.

The main thrust of the refinements that have been applied to these devices has been provided by the continued decrease in device size, which leads to continued device improvements. In its simplest form, the FET consists of a gate electrode structure, typically formed of polysilicon, that is formed on the surface of a layer of gate oxide that has been deposited on the surface of a semiconductor substrate. Self-aligned with and adjacent to the gate electrode are two regions in the surface of the substrate of opposite conductivity type that are referred to as the source and the drain regions. Points of electrical contact are established to the source and drain regions in addition to the surface region of the gate electrode.

With the continued decrease in device dimensions, it has become increasingly more important to find solutions to problems that are caused by misalignments between the successive mask patterns that are applied to create FET devices. It is for instance of great importance that the source and drain regions are in good alignment with the gate electrode, it is also of great importance that regions to which electrical contacts are to be established are in good alignment in order to assure electrical isolation and the avoidance of electrical shorts between these regions. By using the body of the gate electrode as a mask during ion implantation for the creation of the source and drain regions, good alignment can be obtained for these regions. To separate the source/drain contacts from the contact that is established with the surface of the gate electrode, gate spacers are created on the sidewalls of the gate electrode. To further reduce contact resistance with the points of electrical contact of the gate electrode, these contact regions are salicided. This is accomplished by forming a silicide film of a metal that has a high melting point on these surfaces. A titanium silicide film is mainly used as the high melting point silicide film while cobalt silicide and nickel silicide film have also been investigated. The basic success of forming salicided contact layers can be achieved due to the fact that certain metals, such as titanium or cobalt, react when heated while they are in contact with silicon. This reaction forms conductive silicides over the surface of the silicon while the metal however does not react with silicon oxides. By forming silicon oxide spacers on the sidewalls of the gate electrode, the deposited metal does not interact with the sidewalls of the gate electrode and separate points of electrical contact can be formed for the source/drain regions and the surface of the gate electrode.

For the operation of a FET device, an electrical voltage is applied between the source and the drain regions. Very little current will flow as a result of this electrical voltage because one of the two interfaces (PN junctions) that exist between the underlying silicon substrate and the source/drain regions will always be back biased. The region of the silicon substrate that exists underneath the gate electrode can however be electrically controlled (biased) whereby the minority carriers that are present in this region (the channel region) are increased to a level that is sufficiently high such that this region assumes the same conductivity type as the source/drain regions and, as a consequence, current can flow more freely. Improved FET device performance is achieved by reducing the channel length of the device while simultaneously keeping the resistance between the channel region and the source/drain regions as high as possible. The latter objective is accomplished by the introduction of Lightly Doped Drain (LDD) regions that extend from both sides of the gate electrode with a very light (and not deep) implant into the surface of the substrate.

The formation of an n-type channel MOS device that has salicided source/drain contacts in addition to salicided gate electrode will be detailed in the following section. The process starts with a clean, blank p-type semiconductor surface into which field isolation regions of for instance thick oxide are provided. The field isolation regions bound and define the active regions in the surface of the substrate. Another method of bounding the active areas in the surface of the substrate can establish regions of Shallow Trench Isolation in the surface of the substrate. Next a thin layer of gate oxide is grown over the surface of the substrate by, for instance, using methods of thermal oxidation. A layer of polysilicon is then deposited over the gate oxide layer, this layer of poly is provided with a n-type conductivity and patterned thereby forming the body of the gate electrode. The etch to form the body of the gate electrode removes the layer of poly and the layer of gate oxide in accordance with the pattern of the gate electrode. An n-type ion implant is performed into the surface of the substrate that is self-aligned with the body of the gate electrode, this implant forms the LDD regions of the gate electrode. Gate spacers are next formed in the sidewalls of the body of the gate electrode by a blanket CVD deposition of a layer of silicon oxide over the surface of the gate electrode and its surrounding area. The layer of silicon oxide is anisotropically etched thereby forming the gate spacers. A second (relatively deep and heavily doped) n-type implant is performed into the surface of the substrate, thereby forming the source/drain regions of the gate electrode.

Electrical contacts remain to be established with the source/drain regions and the surface of the gate electrode. A layer of refractory metal is blanket deposited and is subjected to a heat treatment. This heat treatment causes the layer of refractory metal to react with the underlying layer of poly and the underlying surface of the source and drain regions whereby this layer of refractory metal is fully converted to a reacted refractory metal or silicide over these regions. The unreacted refractory metal has not formed silicide and is therefore removed (essentially from the surface of the gate electrode spacers) leaving the silicided metal in place over the surface of the source/drain regions and over the surface of the gate electrode.

The Prior Art gate electrode can then be completed by depositing a layer of dielectric over the surface of the structure, by etching openings through this layer of dielectric whereby these openings align with the source/drain regions and with the top surface of the gate electrode. A layer of metal is then blanket deposited over the surface of the layer of dielectric thereby including the created openings. This latter layer of metal is patterned and etched thereby creating electrical contacts with the source/drain regions of the gate electrode in addition to electrical contact with the top surface of the gate electrode. These three contact points are typically connected to a surrounding network of interconnect metal lines.

U.S. Pat. No. 5,600,168(Lee) shows a gate CMP process similar to the process of the invention.

U.S. Pat. No. 5,943,576(Kapoor) shows an inverse gate with sidewall spacer process.

U.S. Pat. No. 5,969,396(Pan et al.) CSM shows a polycide gate electrode process.

U.S. Pat. No. 5,963,818(Kao et al.) shows a combined STI and damascene gate electrode process.

U.S. Pat. No. 5,837,612(Ajuri et al.) shows a STI process.

SUMMARY OF THE INVENTION

A principle objective of the invention is to provide a method of forming gate electrodes that provides a protective nitride film that protects the gate oxide layer during front-end gate processing.

Another objective of the invention is to provide a method that allows selective masking for the exposure of the active device area for the formation of silicided layers.

Yet another objective of the invention is to provide a method that negates the need for very high definition photolithography for the formation of extremely narrow gate structures.

A still further objective of the invention is to eliminate the need for plasma etch during front-end processing thereby eliminating a source of surface damage to the gate oxide.

A still further objective of the invention is to reduce the path of the leakage current between the gate structure and the source/drain regions of the gate by eliminating the exposure of the nitride spacer material to the deposition or formation of the Ti/Co metal that is deposited during the process of salicidation.

In accordance with the objectives of the invention a new method is provided for the integration of a T-top gate electrode process. A layer of pad oxide is grown over the surface of a silicon substrate, a layer of nitride is deposited over the layer of pad oxide. A photoresist mask is created on the surface of the layer of nitride for the formation of shallow Trench Isolation (STI) regions that bound and define the active region in the surface of the substrate. The trenches for STI regions are etched through the layer of nitride, pad oxide and into the surface of the substrate. The STI trenches are filled after which the patterned layer of nitride is removed from the surface of the layer of gate oxide. The layer of pad oxide is removed followed by growing a layer of sacrificial oxide over the exposed surface of the substrate followed by the deposition of a thin layer of nitride that covers the surface of the created layer of sacrificial oxide and the surface of the STI regions. The advantage of the thin layer of nitride is that this thin layer of nitride protects the surface of the STI oxide. A layer of TEOS oxide is deposited, the thickness of this layer of TEOS oxide equals the height of the gate structure that needs to be formed. A layer of photoresist is deposited and patterned using a reverse gate mask thereby creating openings in the layer of photoresist where the layer of TEOS oxide must be etched. The layer of TEOS oxide is etched in accordance with the pattern that has been created in the layer of photoresist, gate spacers are next formed by the deposition and etching of a thin layer of gate spacer nitride leaving gate spacers on the sidewalls of the openings that have been created in the layer of TEOS. The required implants (such as channel implant and threshold implant) are performed, the gate structure is then grown in the openings that have been created in the layer of TEOS oxide. This growing of the gate structure starts with growing the gate oxide layer at the bottom of the openings followed by the possible deposition of suitable barrier layers (such as TaN), followed by the deposition of suitable gate materials. After the gate structure has been completed, the surface of the created structure is polished and the remaining layer of TEOS oxide is removed. Source and drain regions implant is now performed, LDD regions are implanted using a tilt implant that is tilted with respect to the surface of the substrate. This tilt implant penetrates underneath the body of the created gate structures thereby creating the LDD regions. The removal of the layer of TEOS oxide leaves in place the gate structures, one such structure is located in the active region of the surface of the substrate, two additional structures that have been created on the surface of the STI regions.

BRIEF DESCRIPTION OF THE DRAWINGS

FIGS. 1 through and including FIG. 13 address the process of the invention, as follows:

DESCRIPTION OF THE PREFERRED EMBODIMENTS

Figure 1:
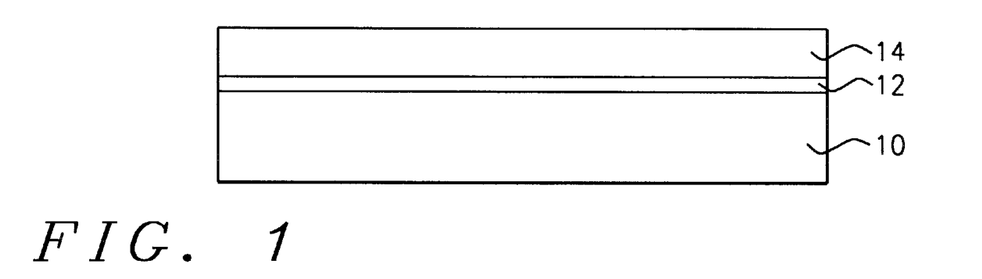
FIG. 1 shows a cross section of a silicon substrate over which a layer of pad oxide has been grown, a layer of nitride has been deposited over the layer of pad oxide.

Referring now specifically to FIG. 1, there is shown the cross section of a silicon substrate 10 over which a thin layer 12 of pad oxide has been grown, a layer 14 of nitride has been deposited over the surface of the layer 12 of pad oxide.

The layer 12 of pad oxide is deposited on the bare silicon after the silicon surface has been cleaned. The layer consists of an about 50 to 500 Angstrom thick layer of $SiO_2$ and can be thermally grown on the surface of the wafer. The purpose of this layer is to cushion the transition of the stress between the silicon substrate and the subsequently deposited layer 14 of nitride. In general, the thicker the layer 12 of pad oxide, the less edge force is being transmitted from the nitride 14 to the silicon substrate 10. On the other hand, a thick layer of padoxide will render the nitride layer 14 ineffective as an oxidation mask by allowing lateral oxidation to take place. Therefore, the minimum pad-oxide that will avoid the formation of dislocations should be used. Typically, a blanket pad oxide can be formed to a thickness of about 150 Angstrom through a thermal oxidation method at a temperature of about 900 degrees C. for a time period of about 10 to 20 minutes. The layer 12 of thin oxide can also be created using conventional deposition technology and can, for instance, be deposited using PECVD procedures at a temperature of between about 350 and 450 degrees C. to a thickness between about 125 and 150 Angstrom using TEOS or $SiH_4$ as a source.

The layer 14 of silicon nitride ($Si_3Ni_4$) can be deposited using LPCVD or PECVD procedures at a pressure between about 200 mTorr and 400 mTorr, at a temperature between about 600 and 800 degrees C., to a thickness of about 1500 to 3000 Angstrom using $NH_3$ and $SiH_4$ or $SiCl_2H_2$. The silicon nitride layer 14 can also be deposited using LPCVD or PECVD procedures using a reactant gas mixture such as dichlorosilane ($SiCl_2H_2$) as a silicon source material and ammonia ($NH_3$) as a nitrogen source, at a temperature between about 600 and 800 degrees C., at a pressure between about 300 mTorr and 400 mTorr, to a thickness between about 200 and 300 Angstrom.

Figure 2:
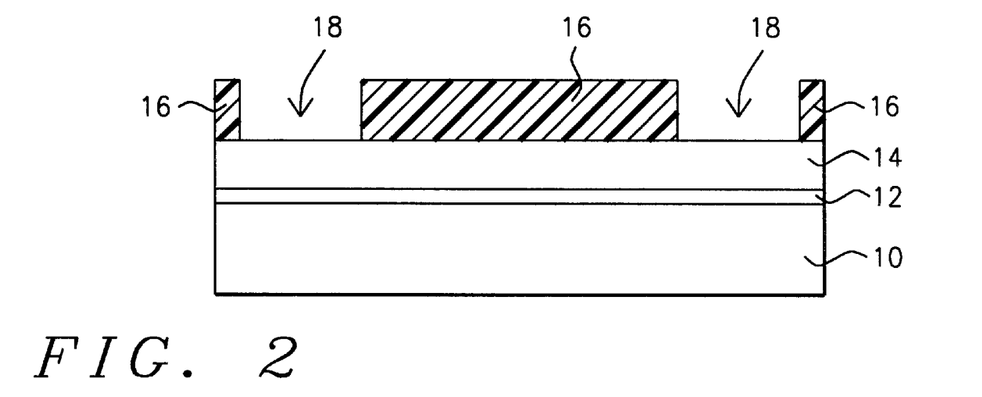
FIG. 2 shows the cross section after a layer of photoresist has been deposited and patterned creating openings in the layer of photoresist that align with the to be created STI regions.

FIG. 2 shows the cross section after a layer 16 of photoresist has been deposited and patterned creating openings 18 in the layer of photoresist that align with the surface area of the silicon substrate 10 where the STI regions are to be created.

The process of deposition and patterning the layer of photoresist uses conventional methods of photolithography and masking. Layer 16 of photoresist can be etched by applying $O_2$ plasma and then wet stripping by using $H_2SO_4$, $H_2O_2$ and $NH_4OH$ solution. The openings 18 that are in this manner created in the layer 16 of photoresist expose the surface of the layer of nitride where trenches for the STI are to be created.

Figure 3:
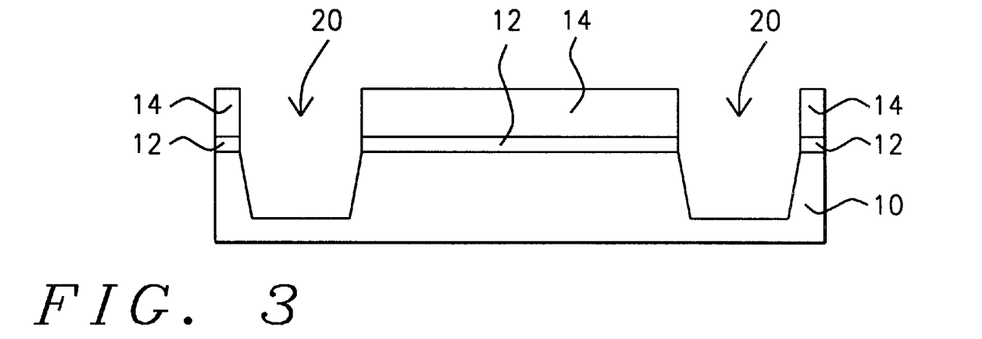
FIG. 3 shows the cross section after the trenches for the STI regions have been created.

FIG. 3 shows the cross section after the trenches 20 for the STI regions have been created in the surface of the substrate 10 using the mask that is provide by the layer 16 of photoresist, the patterned layer of photoresist 16 has been removed from the surface of the patterned layer 14 of nitride. The stop layer 14 of silicon nitride can be etched using a SiON or SiN removal process with etchant gasses $CH_3F/Ar/O_2$ at a temperature between about 10 and 20 degrees C., a pressure of between about 50 and 60 mTorr with an etch time of between about 40 and 60 seconds. The silicon nitride layer 14 can also be wet etched using a buffered oxide etchant (BOE). The BOE may comprise a mixed solution of fluoroammonium and fluorohydrogen (7:1) and phosphoric acid solution. The silicon nitride layer 14 can also be etched using anisotropic RIE using $CHF_3$ or $SF_6$—$O_2$ or $SF_6/HB_8$ as an etchant. The preferred method of removing silicon nitride is an isotropic wet etch process using hot phosphoric acid. The silicon nitride layer 14 can also be dipped into phosphoric acid ($H_3PO_4$) to be removed. The nitride layer can also be removed from the trenches created in the layer of photoresist by dipping the structure into hot phosphoric acid ($H_3PO_4$) (standard wet nitride removal).

Standard RIE procedures, using $CF_4/CHF_3$ as etchant gas, can be used to etch openings in the thin layer 12 of pad oxide.

The shallow trenches 20 etched into the surface of substrate 10 are anisotropically plasma etched into the silicon substrate 10 and are typically between 0.2 and 0.5 micrometer (um.) deep. STI trenches are formed around the active device to a depth between about 2000 and 5000 Angstrom.

Figure 4:
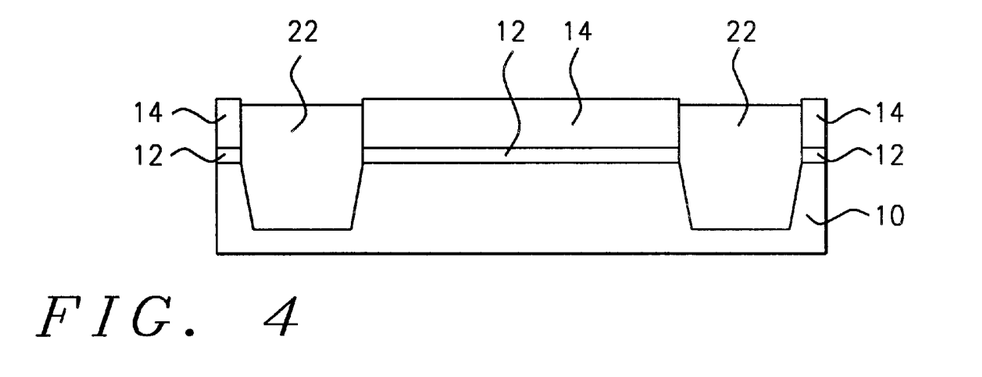
FIG. 4 shows the cross section after the STI trenches have been filled and CMP has been completed.

FIG. 4 shows a cross section of how, after the trenches 20 have been etched into the surface of substrate 10, a layer 22 of CVD silicon oxide ($SiO_2$) is deposited into the trenches 20 so that the trenches 22 form areas of insulation dielectric which act to isolate active devices in the surface of the substrate and to therefore reduce the cross talk between active devices. The excess deposited oxide is polished off and the trench planarized to prepare for the next processing steps.

Figure 5:
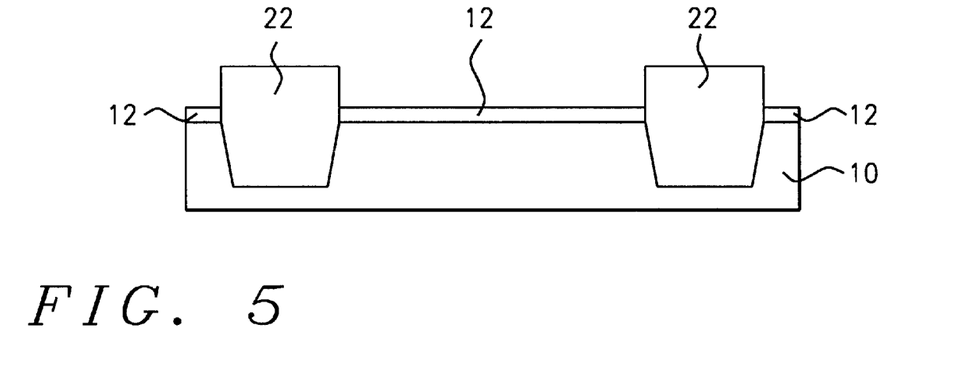
FIG. 5 shows the cross section after the layer of nitride has been removed from the surface of the pad oxide.

FIG. 5 shows the cross section after the layer 14 (FIG. 4) of nitride has been removed from the surface of the pad oxide. This removal of the layer 14 of nitride is achieved by dipping the structure into hot phosphoric acid ($H_3PO_4$) (standard wet nitride removal).

Figure 6:
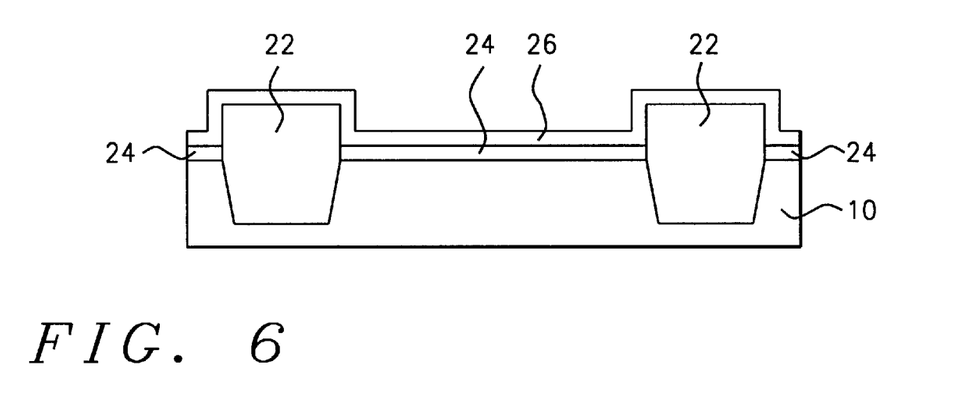
FIG. 6 shows the cross section after the layer of pad oxide has been removed, another layer of SAC oxide has been grown followed by the deposition of a thin layer of nitride.

FIG. 6 shows the cross section after the layer of pad oxide (layer 12, FIG. 5) has been removed, another layer 24 of SAC oxide has been grown followed by the deposition of a thin layer 26 of nitride.

Standard photolithography and RIE procedures, using $CF_4/CHF_3$ as etchant gas, can be used to remove the layer 12 of pad oxide. Layer 12 of pad oxide can also be etched using $Ar/CF_4$ as an etchant at a temperature of between about 120 and 160 degrees C. and a pressure of between about 0.30 and 0.40 Torr for a time of between about 33 and 39 seconds using a dry etch process.

The preferred processing conditions for the growing of layer 24 of sacrificial oxide are as follows: source: wet $O_2$, flow rate for the $O_2$ is about 0 to 10 sccm, flow rate for the $H_2$ is about 15 slpm, temperature of about 875 degrees C., under atmospheric pressure, time of about 30 minutes, a furnace is used due to the thermal oxide, grown to a thickness of between about 100 and 300 Angstrom.

The deposition of the silicon nitride layer 26 can be achieved using the same processing conditions as have previously been highlighted for the deposition of layer 14, FIG. 1. Layer 26 of FIG. 6 is preferably grown to a thickness of between about 100 and 500 Angstrom.

The advantage of the layer 26 of nitride is that this layer is deposited over the surface of the STI regions 22 and therefore protects the surface of the STI oxide from damage during subsequent processing.

Figure 7:
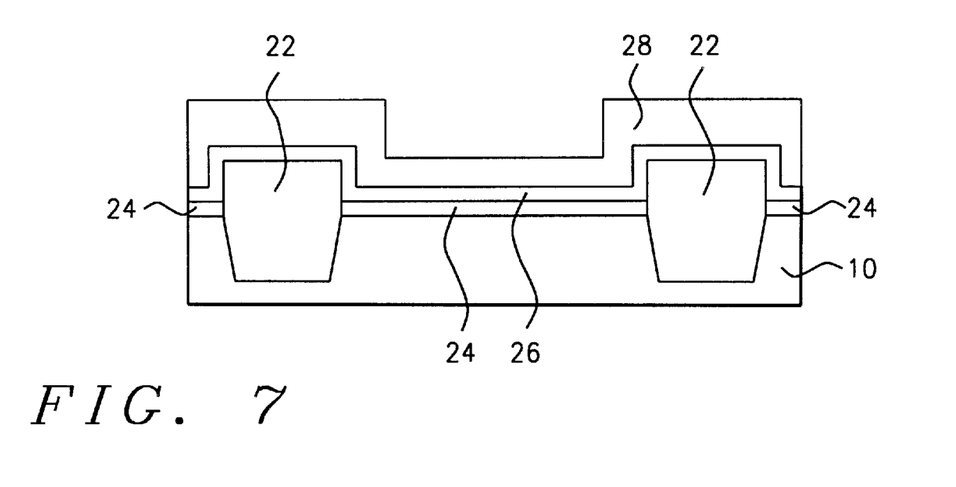
FIG. 7 shows the cross section after a layer of TEOS has been deposited over the thin layer of nitride.

FIG. 7 shows the cross section after a layer 28 of tetra-ethyl-ortho-silicate (TEOS) has been deposited over the thin layer 26 of nitride.

The preferred processing conditions for the deposition of layer 28 of insulating material are as follows: source: TEOS, flow rate between about 80 and 100 sccm, temperature between about 680 and 730 degrees C., pressure between about 240 and 260 mTorr, processing chamber used: an LP system, time of deposition about 60 minutes. The thickness to which the layer 28 of TEOS is deposited is determined by the height of the gate structure that is to be created, the indicated time of deposition may therefore accordingly have to be adjusted. A typical thickness for layer 28 of TEOS is between about 1000 and 10,000 Angstrom.

Figure 8:
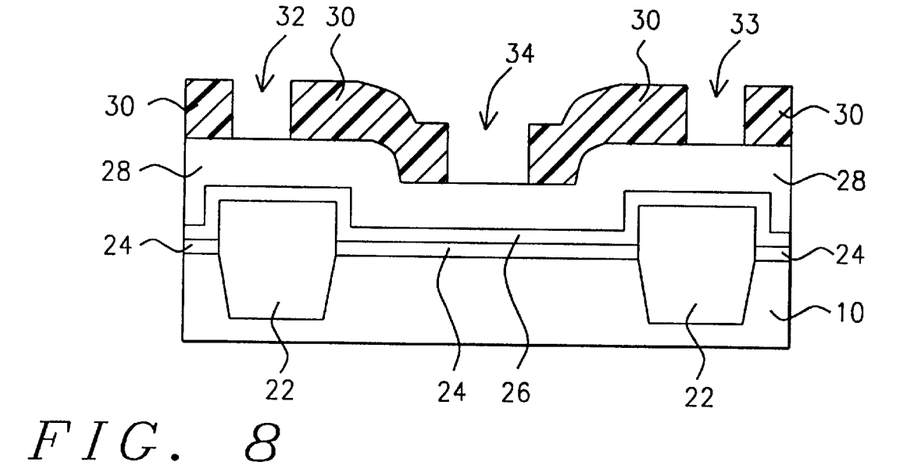
FIG. 8 shows the cross section after a layer of photoresist has been deposited and patterned for the formation of openings in the layer of TEOS where gate electrodes need to be formed.

FIG. 8 shows the cross section after a layer 30 of photoresist has been deposited and patterned for the formation of openings 32 and 34 in the layer 28 of TEOS. Gate electrodes need to be formed underneath the openings 32 and 34 that have been created in layer 30 of photoresist.

The process of deposition and patterning the layer 30 of photoresist uses the previously highlighted and conventional methods of photolithography and masking. Layer 30 of photoresist can be etched by applying $O_2$ plasma and then wet stripping by using $H_2SO_4$, $H_2O_2$ and $NH_4OH$ solution. It must be noted that the exposure of the layer 30 of photoresist uses a reverse mask whereby however the mask size for the central opening 34 is enlarged. This enlargement is needed to allow for a subsequent LDD implant into the gate electrode that is created in the center of the active regions of the substrate surface. As shown in FIG. 8, the diameter of opening 34 is larger than the diameter of openings 32 for the purpose stated.

Figure 9:
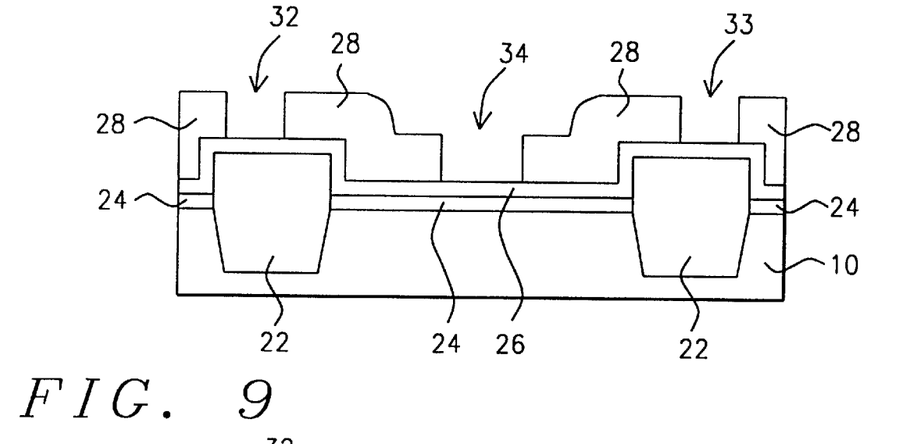
FIG. 9 shows the cross section after the layer of TEOS has been etched thereby creating openings in the layer of TEOS for the formation of gate electrode structures, the patterned layer of photoresist has been removed from the surface of the layer of TEOS.

FIG. 9 shows the cross section after the layer 28 of TEOS has been etched in accordance with the pattern that has been created in the overlying layer of photoresist, layer 30 of FIG.

The preferred etching conditions for the etch of TEOS layer 28 are as follows: etchant gas: $CF_4$ or $CHF_3$ at a flow rate of about 15 sccm, gas pressure about 800 mTorr, rf power density about 400 Watts, no magnetic field applied, wafer temperature about −17 degrees C., time of the etch about 10 seconds.

After the layer 28 of TEOS has been etched, the layer 30 of photoresist is removed from the surface of the etched layer 28 of TEOS using conventional methods of ashing and washing.

At this time in the processing flow of the invention, gate spacers must be created. Spacers for gate electrodes can be made using a variety of materials such as silicon oxide, BSG, PSG, other materials preferably of a dielectric nature, CVD oxide formed from a TEOS source.

Figure 10:
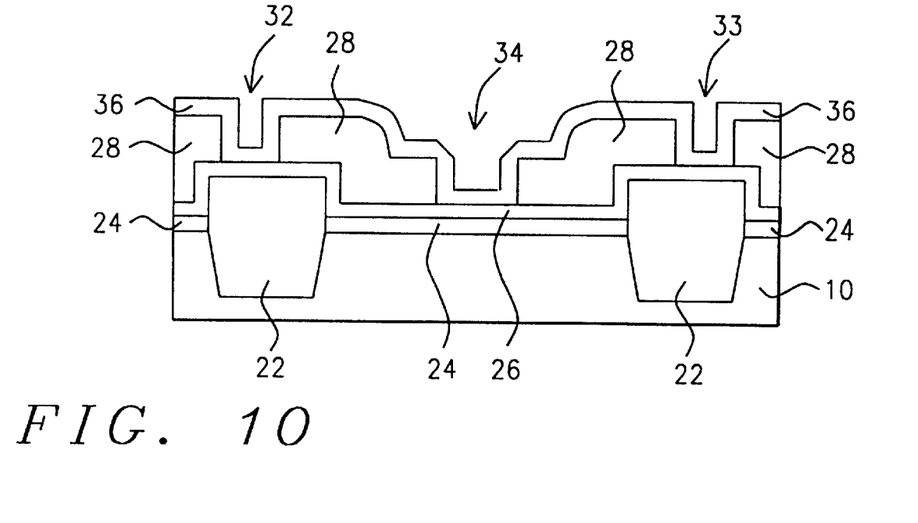
FIG. 10 shows the cross section after a layer of gate spacer material has been deposited.

FIG. 10 shows the preferred gate spacer material of the invention, that is a layer 36 of silicon nitride ($S_iN_x$) that is deposited over the surface of the layer 28 of TEOS using LPCVD procedures (for better step coverage) at a pressure between about 200 mTorr and 800 mTorr, at a temperature between about 600 and 800 degrees C., to a thickness between about 250 and 2000 Angstrom.

Figure 11:
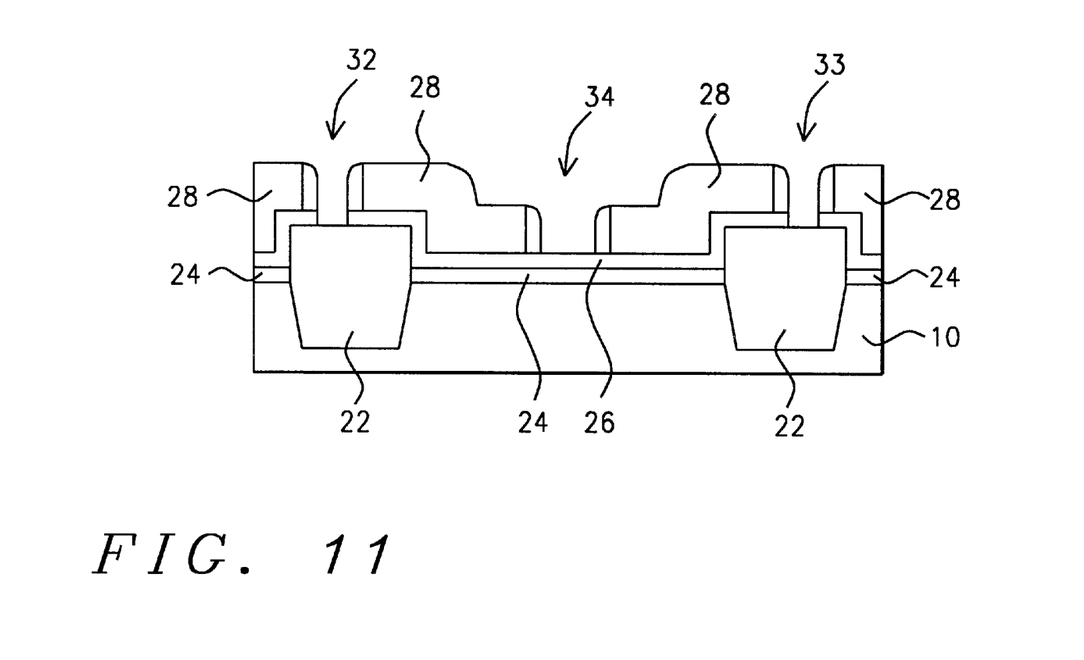
FIG. 11 shows the cross-section after the gate spacers have been formed on the sidewalls of the openings where gate electrode structures are to be created.

FIG. 11 shows the cross section after the gate spacers 38, 40 and 42 have been formed on the sidewalls of the openings 32, 33 and 34 respectively where gate electrode structure are to be created. The silicon nitride spacers are formed via anisotropic RIE of the silicon nitride layer 36, FIG. 10, using $CHF_3$ or $SF_6$—$O_2$ or $SF_6$—HBr—$O_2$ or $Cl_2$—HBr—$O_2$ as an etchant.

The openings 32 and 33 expose the surface of the STI regions 22 over which gate electrode structures are to be formed, the opening 34 exposes the surface of the substrate 10 in the active surface region of the substrate over which a gate electrode structure is to be formed. Because of this exposure of these surfaces, implants, which have to be performed into this surface, must be performed at this time in the processing sequence of the invention. Such implants are, for instance, channel implants and threshold implants (but not the LDD implant since the LDD implant would at this time be blocked by layers 24, 26 and 28).

The processing conditions for typical channel implants (not shown in FIG. 11) vary widely and are determined by the particular application for which the gate electrode structure is being created. As examples, a channel implant can be a P-well implant using boron with an energy within the range of between 100 to 220 keV and a dose within the range of between 1e13 to 1e14 atoms/$cm^2$, it can be a P-well implant using boron with an energy within the range of between 5 to 40 keV and a dose within the range of between 1e12 to 5e13 atoms/$cm^2$, it can be a P-well implant using indium with an energy within the range of between 50 to 250 keV and a dose within the range of between 1e12 to 1e14 atoms/$cm^2$, it can be an N-well implant using phosphorus with an energy within the range of between 300 to 600 keV and a dose within the range of between 1e13 to 5e14 atoms/$cm^2$., it can be an N-well implant using phosphorus with an energy within the range of between 50 to 300 keV and a dose within the range of between 1e12 to 5e13 atoms/$cm^2$, etc. The well implants that have been indicated above can also be performed after the processing steps that have been indicated under FIG. 4 above with appropriate mark for P-well and N-well.

The method by which components of an integrated circuit are interconnected involves the fabrication of metal strips that run across the oxide in the regions between the transistors, the field regions. However, these metal strips form the gates of parasitic MOS transistors, with the oxide beneath them forming a gate oxide and the diffused regions acting as the source and drain regions. The threshold voltage of these parasitic transistors must be kept higher than any possible operating voltage so that spurious channels will not be inadvertently formed between devices. Several methods have been used to raise the threshold voltage. These methods involve increasing the field oxide thickness or raising the doping beneath the field oxide. The large oxide step however presents problems of step coverage so that reduced oxide thickness is preferred. The doping under the field oxide must therefore be increased. Emphasis is nevertheless still placed on making the field oxide seven to ten times thicker than the gate oxide, this heavy layer of oxide also reduces the parasitic capacitance between the interconnect runner and the substrate. Normally, ion implantation is used to increase the doping under the field oxide. This step is called the threshold implant. The combination of threshold implant with the thick oxide can provide adequate isolation for oxide isolated bipolar IC's.

After the various implants have been performed, implants that as indicated above are highly device type dependent, the structure of the gate electrode needs to be created. This structure in turn can consist of a number of layers that are device dependent. In most typical gate electrode devices, a layer of gate oxide is deposited over the surface of the substrate. The process of the invention performs this process of gate oxide growth at this time in the sequence of processing steps, that is after the gate spacers have been formed on the sidewalls of the openings that have been created in layer 28 of TEOS creating a structure that is shown in cross section in FIG. 11. For the gate electrode structures that are created, the sidewalls of the gate structure may be lined with barrier or seed layers. If these layers are desired to be created, they can at this time be deposited inside the openings 32, 33 and 34. Not all types of barriers may be required for all openings 32, 33 and 34. It is clear that the gate electrodes that will be created in the openings 32 and 33 and that overlay the STI regions are functionally not the same gate electrode that is created in the opening 34. For instance, a typical DRAM cell and its sub-components can be formed on the surface of a semiconductor substrate following essentially the steps of the invention that have been highlighted. The formation of the DRAM cell starts with the isolation of the active area of the DRAM, a thin layer of gate oxide is grown over the silicon surface to serve as stress release. A layer of polysilicon is blanket deposited over which a layer of insulating material is deposited. These two layers are patterned and etched to form gates within the active area of the device and gates on the surface of the field oxide insulating area of the device. The gates in the active area of the device form the gates of the MOSFET device, that is the bit lines of the DRAM device. The gates that are grown over the field oxide isolation areas form the word lines that connect the MOSFET gates (of the DRAM device) to the peripheral circuits that are connected to the DRAM chip. Lightly Doped (LDD) regions for the N-channel MOSFET are then formed, the gate spacers are formed over the surface of the patterned polysilicon gates. The source and drain regions are formed by implant with an N-type dopant. The bit line to the gate of the MOSFET device is formed by conventional methods of lithography and patterning. The storage node self-aligned contact points are made in a similar manner. One (or more) layers of insulation are then deposited over the structure to provide protection during further processing steps. The gate structures that are created following the above briefly highlighted process of forming a DRAM cell will not contain the same sequence of layers but will be tailored to specific functions which require the deposition of specific materials.

After the gate electrode structures of the invention have been completed, residual layers (of, for instance, gate oxide) must be removed by either chemical processing or by methods of CMP. As a final step the layer 28 of TEOS must be removed by either wet processing or by suitable masking. The processing conditions for the removal of the layer 28 of TEOS have previously been indicated under FIG. 9 above, as follows: etchant gas: $CF_4$ or $CHF_3$ at a flow rate of about 15 sccm, gas pressure about 800 mTorr, rf power density about 400 Watts, no magnetic field applied, wafer temperature about −17 degrees C., time of the etch about 10 seconds.

Figure 12:
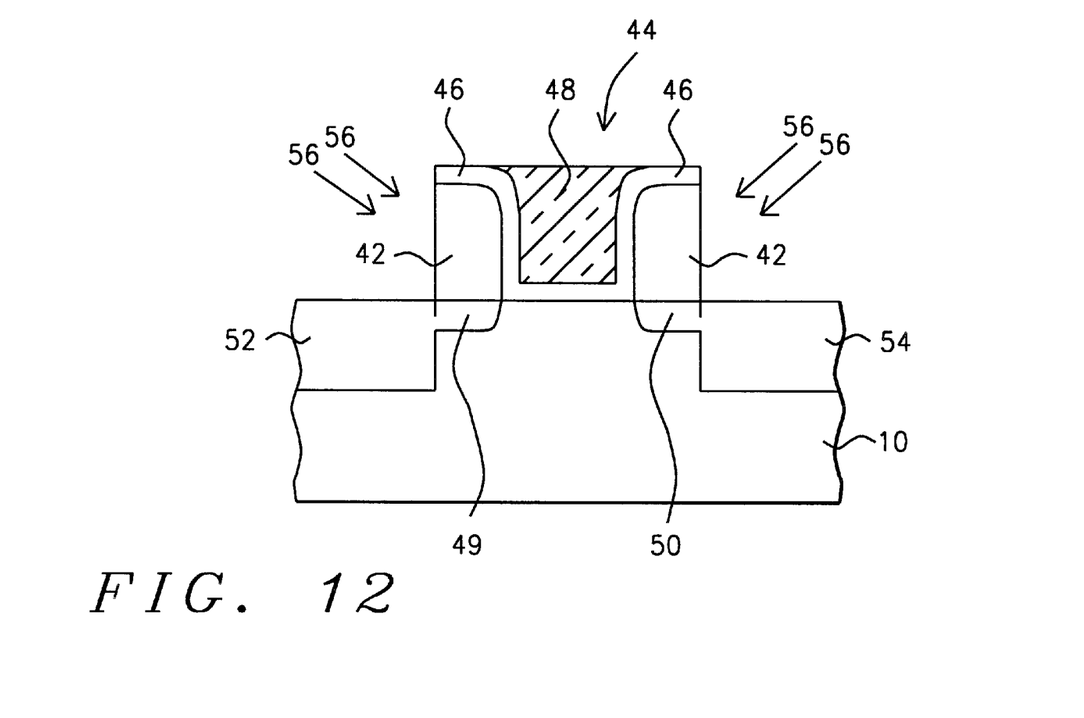
FIG. 12 shows the cross section after the structure of the gate electrodes has been formed and the layer of TEOS has been removed, LDD and source/drain region implants have also been performed.

FIG. 12 shows a cross section of the gate structure 44 that has been created above the active region of substrate 10, this as opposed to the gate structures that have been created above the STI regions 22. Shown in this cross section are the gate spacers 42, a layer 46 that may contain barrier or seed material and a layer 48 that forms the body of the gate structure and contains gate material.

Layer 48, which forms the body of the gate electrode, can contain polysilicon but can also contain refractory metals, silicides and other conductive materials while doped polysilicon can also be used. A typical barrier layer is formed of titanium nitride, tantalum, tungsten, niobium, molybdenum, Ti/TiN or Ti/W and is more preferably formed from TiN.

Further shown in FIG. 12 are the implants 52 (forming the source region of the MOS device) and 54 (forming the drain region of the MOS device) and the LDD implants 49 (for the source region) and 50 (for the drain region).

LDD implants 49 and 50 are performed to reduce or eliminate the occurrence of leakage current between the gate electrode and the underlying silicon substrate. A typical n-channel transistor for a MOS device is formed by first forming a p-region (also called tub or well) in the surface of an n-type silicon substrate. A layer of gate oxide is first formed over the surface of the substrate. A layer of gate material such as polysilicon or the like is deposited over the layer of gate oxide and patterned and etched to form the structure of the gate electrode. Source and drain regions are then formed self-aligned with and adjacent to the gate electrode by implanting of high-concentration n-type impurities into the surface of the silicon substrate. In the era of ULSI devices, the width of the gate has been reduced to below 0.5 um, the distance between the source and the drain region (the channel length) is correspondingly reduced. This sharp reduction in channel length however leads to a significant increase in the concentration of the electromagnetic field close to the drain region where this drain region interfaces with the underlying silicon substrate. This sharp increase may lead to leakage current between the drain region and the surrounding silicon of substrate. In addition, hot carriers can be created in the silicon of the substrate and can gain sufficient energy to penetrate into the layer of gate oxide underneath the gate structure resulting in impacting the threshold voltage between the gate and the substrate. This may lead to current flow between the gate electrode and the underlying substrate.

To counteract the increase in the electric field, the art has implemented the formation of Lightly Doped Drain (LDD) regions that are adjacent to and self-aligned with the gate electrode structure. The LDD regions form double offset regions whereby the source and drain regions now contain high n-type impurity concentrations and low n-type impurity concentrations. The principle objective of the LDD regions is to offset the high concentration of the electric field around the drain region of the gate electrode. The regions are symmetrically formed around the gate electrode and consist of low-concentrations of n-type impurities. The profile of the implanted regions is such that the impurity concentrations in the p-n junction change gradually thereby extending to the source and drain regions to attenuate the electric field.

With the creation of the LDD regions, the breakdown between the drain region of the gate electrode and the channel region (that is between the source and the drain region of the gate electrode) has been eliminated. Hot carriers that could effect the threshold voltage are thereby also eliminated.

Processing conditions for threshold or LDD implants are also determined by the type of device that is being created. For instance, if the device is a NMOS device, the implant uses arsenic or phosphorous with an energy within the range of between 5 to 60 keV and a dose within the range of between 1E15 to 5E15 atoms/cm$^2$. If the device is a PMOS device, the LDD implant uses $BF_2$ or B with an energy within the range of between 1 to 30 keV and a dose within the range of between 1E13 to 5E14 atoms/cm$^2$.

It is to be noted that the LDD implant 56 is made under an angle with the surface of the substrate 10, this to assure that the implant penetrates under the gate spacers 42.

Source (52) and drain implants (54) are also be made under different processing conditions that are dependent on the requirements for the device that is being created. For instance a first conductivity imparting dopant using phosphorous can be implanted to create a lightly doped source and drain regions, ion implanted at an energy between about 5 to 60 KeV, at a dose between about 1E12 to 1E14 atoms/cm$^2$. A second conductivity imparting dopant can be used to create medium doped source and drain regions, such as arsenic or phosphorous, ion implanted at an energy between about 5 to 60 KeV, at a dose between about 1E13 to 5E14 atoms/cm$^2$. A third conductivity imparting dopant can be used to create heavily doped source and drain regions, such as arsenic, ion implanted at an energy between about 5 to 60 KeV, at a dose between about 1E15 to 5E15 atoms/cm$^2$.

Figure 13:
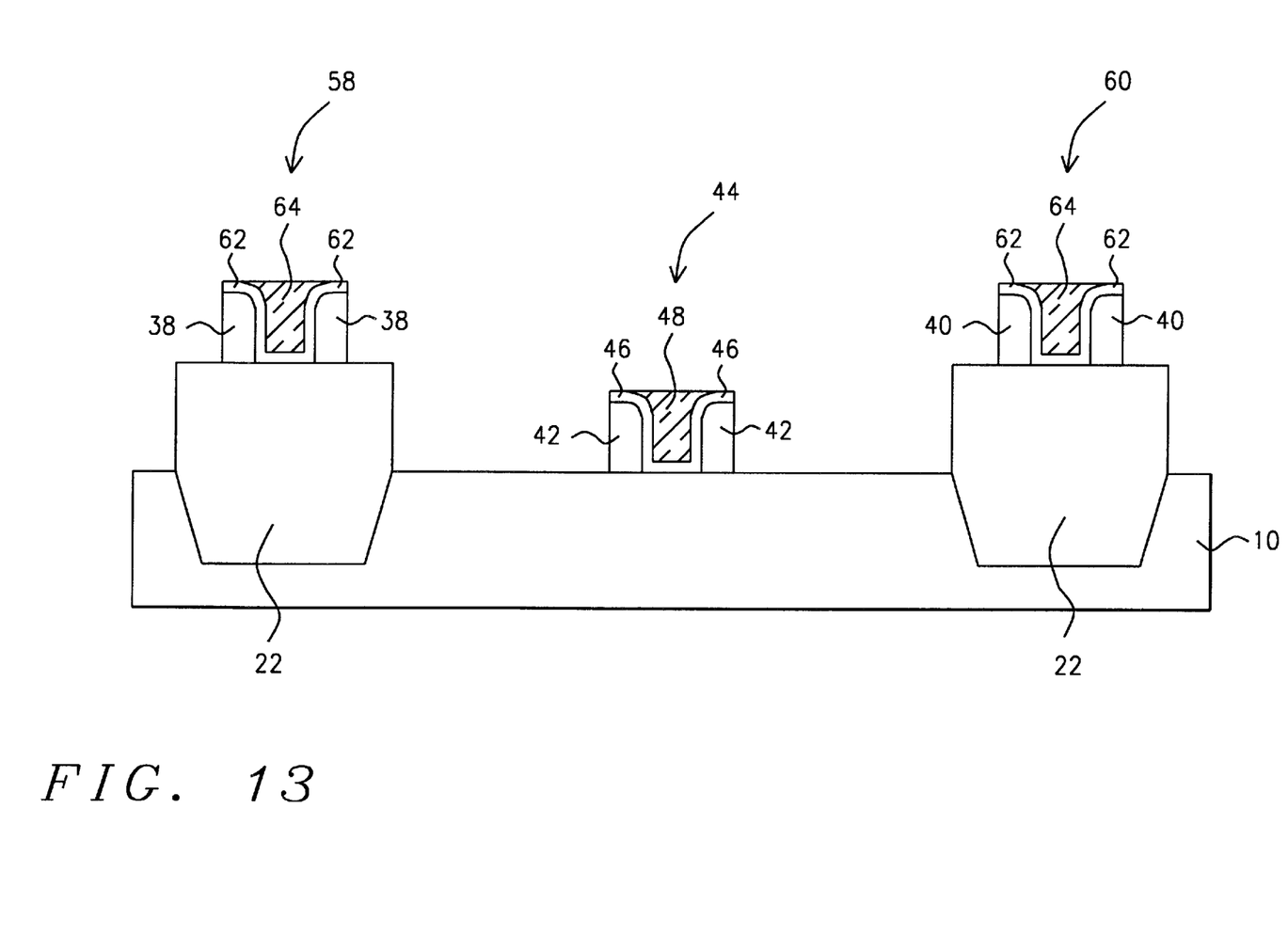
FIG. 13 shows the cross section of the completed gate electrode structures overlying the active region in the surface of the substrate and overlying the STI regions.

FIG. 13 shows a cross section where all three gate electrode structures that have been created using the process of the invention are shown, that is gate 44 overlying the active regions in the surface of substrate 10, gate 58 overlying the left STI regions and gate 60 overlying the right STI region. Barrier or seed liners 62 that have been provided along the sidewalls of gate 58 and 60 have been highlighted as well as the gate material 64 that is used for the body of gate electrodes 58 and 60.

At this point in the process of the invention, normal processing can proceed as previously has been highlighted for the cited example of the creation of a DRAM cell or as has previously been highlighted under FIGS. 1 through 3. That is the process of salicidation may be applied to the source/drain regions and the surface of the gate structures, a layer of dielectric is deposited over the surface of the structure that is shown in cross section in FIG. 13, openings can be etched through this layer of dielectric whereby these openings overlay and align with the source and drain regions of the gate electrodes and with the top surface of the gate electrodes. A layer of metal is then blanket deposited over the surface of the layer of dielectric thereby including the openings that have been created in the layer of dielectric. This latter layer of metal is patterned and etched thereby creating electrical contacts with the source/drain regions of the gate electrodes as well as with the top surface of the gate electrode. These contact points are typically connected to a surrounding network of interconnect metal lines.

The advantages that the process of the invention provides can be summarized as follows:

- by depositing a thing layer of nitride (layer 36, FIG. 10) over the surface of the layer of TEOS (layer 28, FIG. 10) thereby including the openings that have been created in the layer of TEOS, the surface and edge of the STI regions 22 are protected through the processing steps of forming the gate structures including the steps of forming gate spacers, gate lines and the body of the gate
- the process of the invention results in the formation of self-aligned (T-top shaped) gate structures, the structures are self-aligned with the openings that have been created in the layer of TEOS
- the process of the invention has eliminated the need for masking of the gate structure that typically is required to pattern and etch (poly or other) gate structures. This reduces photolithography alignment requirements while eliminating the risk of etching through the layer of gate oxide (during the plasma etch of the gate structure) and thereby creating micro trenches in the surface of the substrate
- the gate spacers remain, during the steps of depositing barrier and/or seed layers, covered with the layer of TEOS and is therefore protected during these processing steps. The leakage current that therefore typically can occur between the body of the gate electrode and the source/drain regions (through the exposed, outside surface of the gate spacers that is not adjacent to the body of the gate structure) is therefore reduced since the exposed surface of the gate spacers is less prone to damage (during typical steps of barrier/seed layer deposition and ion implants).

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for forming self-aligned T-top gate electrode structures over active and over Shallow Trench Isolation (STI) regions of a substrate, comprising the steps of:

providing a substrate having a surface, the surface of said substrate having undergone preliminary processing;

depositing a thin layer nitride over the surface of said pre-processed substrate, said thin layer of nitride having a surface;

depositing a layer of TEOS over the surface of said thin layer of nitride, said layer of TEOS having a surface;

patterning and etching said layer of TEOS down to the surface of said thin layer of nitride, creating openings in said layer of TEOS, said openings being aligned with said active and Shallow Trench Isolation (STI) regions on the surface of said substrate where said self-aligned T-top gate electrode structures need to be created;

depositing a thin layer of nitride over the surface of said patterned layer of TEOS, including said openings created in said layer of TEOS;

etching said layer of nitride, forming gate spacers on sidewalls of said openings created in said layer of TEOS;

creating self-aligned T-top gate electrode structures having a surface by depositing a sequence of layers of materials that constitute gate electrodes, removing any excess depositions from the surface of said layer of TEOS; and removing said patterned layer of TEOS, completing creation of said self-aligned T-top gate electrode structures.

2. The method of claim 1 wherein said preliminary processing of said substrate comprises the steps of:

growing a layer of pad oxide over the surface of said substrate, said layer of pad oxide having a surface;

depositing a layer of nitride over the surface of said layer of pad oxide;

patterning and etching said layer of nitride thereby including said layer of pad oxide grown over the surface of said pad oxide, creating openings in said layer of nitride and said layer of pad oxide, said openings exposing the surface of said substrate in regions where STI trenches need to be created;

etching said substrate in accordance with said openings created in said layer of nitride and said layer of pad oxide, creating STI trenches;

filling said STI trenches with an isolation material, creating regions of STI, said regions of STI having a surface;

removing said patterned layer of nitride, further removing said patterned layer of pad oxide; and growing a layer of sacrificial oxide over the surface of said substrate, including the surface of said regions of STI.

3. The method of claim 1 with an additional step of performing back-end processing of said self-aligned T-top gate electrode structures.

4. The method of claim 3 wherein said back-end processing comprises the steps of:

performing a self-aligned source/drain region implant followed by a self-aligned LDD implant into an active surface region of said substrate, said implants being self-aligned with gate electrode structures created over the active surface of said substrate, said self-aligned LDD implant being performed under an angle with the surface of said substrate;

depositing a layer of dielectric over the surface of said substrate, including the surface of said self-aligned T-top gate electrode structures, said deposited layer of dielectric having a surface;

patterning and etching said layer of dielectric, creating openings in said layer of dielectric, said openings being aligned with said created source and drain regions in addition to the surface of said self-aligned T-top gate electrode structures;

depositing a layer of conductive material over the surface of said dielectric, including said openings created in said layer of dielectric, said layer of conductive material having a surface, followed by planarizing the surface of said layer of conductive material; and patterning and etching said layer of conductive material, creating points of electrical contact between said source/drain regions and the surfaces of said self-aligned T-top gate electrode structures and a network of interconnect conductive lines.

5. The method of claim 4 with an additional step of saliciding said source/drain regions in addition to saliciding said self-aligned T-top gate electrode structures.

* * * * *